(12) United States Patent
Park

(10) Patent No.: US 6,281,118 B1
(45) Date of Patent: Aug. 28, 2001

(54) METHOD OF MANUFACTURING SEMICONDUCTOR DEVICE

(75) Inventor: Sang Wook Park, Seoul (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/328,695

(22) Filed: Jun. 9, 1999

(30) Foreign Application Priority Data

Jun. 30, 1998 (KR) .................................................. 98-25781

(51) Int. Cl.[7] .............................................. H01L 21/4763
(52) U.S. Cl. .......................... 438/655; 438/664; 438/682; 438/683; 438/649; 438/637
(58) Field of Search ..................................... 438/655–656, 438/637–640, 649, 664, 666–668, 672, 675, 682–683

(56) References Cited

U.S. PATENT DOCUMENTS

| 5,518,960 | * | 5/1996 | Tsuchimoto | 438/655 |
| 5,710,078 |   | 1/1998 | Tseng | 438/620 |

FOREIGN PATENT DOCUMENTS

| 1125955 | * | 5/1989 | (JP) | 438/656 |
| 05006973 |   | 1/1993 | (JP) | H01L/27/102 |

* cited by examiner

Primary Examiner—Charles Bowers
Assistant Examiner—Thanh Nguyen
(74) Attorney, Agent, or Firm—Ladas & Parry

(57) ABSTRACT

A method of manufacturing semiconductor device which can reduce contact resistance and stabilize contact interface, is disclosed. According to the present invention, firstly, a semiconductor substrate on which a lower conductor pattern is formed is provided. The lower conductor pattern has a first doped polysilicon layer and a first tungsten silicide layer formed thereon. Next, an intermediate insulating layer is formed on the substrate. The intermediate insulating layer is then etched to expose a portion of the surface of the first tungsten silicide layer of the lower conductor pattern, thereby forming a contact hole. Thereafter the substrate in which the contact hole is formed, is thermally treated by rapid thermal processing under $H_2$ atmosphere. A second doped polysilicon layer and the second tungsten silicide layer are then formed on the surface of the contact hole treated thermally and on the intermediate insulating, sequentially. Thereafter the second tungsten silicide layer and the second doped polysilicon layer are patterned to form an upper conductor pattern being in contact with the lower conductor pattern.

12 Claims, 3 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device which can reduce contact resistance.

2. Description of the Related Art

In a semiconductor memory device, a cell selection signal is applied to a word line and a data signal is applied to a bit line, so that the data signal is applied to the selected cell. The bit line is in contact with the word line in the periphery region of the memory device. The word line and the bit line are formed to materials having good conductivity, for preventing signal delay. For example, they are generally formed to a tungsten polycide structure in which a tungsten silicide layer is formed on a doped polysilicon layer.

FIG. 1A and FIG. 1B are cross sectional views for describing a conventional method of forming contact between a word line and a bit line in the periphery region of a memory device.

Referring to FIG. 1A, a word line 12 in which a first tungsten silicide (WSix) layer 12b is formed on a first doped polysilicon layer 12a is formed on a semiconductor substrate 10. An intermediate insulating layer 14 is then formed on the overall substrate and etched to expose the portion of the surface of the first tungsten silicide layer 12b of the word line 12, thereby forming a contact hole 16. Thereafter, a second doped polysilicon 18a and a second tungsten silicide layer 18b as materials for a bit line 18 are sequentially formed on the surface of the contact hole 16 and on the intermediate insulating layer 14, as shown in FIG. 1B.

When forming the contact hole 16, plasma gas such as $C_xF_y$, $CF_4+O_2$, $CH_xBr_y$, is used as an etching gas. However, owing to the ion bombardment of the plasma gas, the surface crystal structure for the exposed first tungsten silicide layer 12b of the word line 12 is transformed into an amorphous and/or quasi-stable state, to increase contact resistance between the word line 12 and the bit line 18.

Furthermore, owing to the bonding force difference between W—Si and Si—Si in the first tungsten silicide layer 12b, sputtering yield difference increases. Therefore, as shown in FIG. 1A, the exposed surface of the first tungsten silicide layer 12b is roughed, so that contact resistance between the word line 12 and the bit line 18 further increases and contact interface therebetween is unstablized.

Moreover, the plasma gas reacts with W and/or Si of the first tungsten silicide layer 12b, so that processing productions 100 having negative ΔH as shown in TABLE 1 are created on the exposed surface of the first tungsten silicide layer 12b, and acts as factor increasing the contact resistance.

TABLE 1

| processing productions | Δ H(KJ/mole) |
|---|---|
| WC, SiC | −20.5 |
| $SiO_2$ | −17 |
| WNx | −12.6 |
| $W_2N$ | −72 |
| $WO_2$ | −533 |
| $WO_3$ | −843 |

SUMMARY OF THE INVENTION

It is therefore one object of the present invention to provide a method of manufacturing a semiconductor device which can reduce contact resistance, for solving the problems in the conventional art.

Furthermore, it is another object of the present invention to provide a method of manufacturing a semiconductor device which can stabilize contact interface.

To accomplish these above objects, according to the present invention, firstly, a semiconductor substrate on which a lower conductor pattern is formed is provided. The lower conductor pattern has a first doped polysilicon layer and a first tungsten silicide layer formed thereon. Next, an intermediate insulating layer is formed on the substrate and etched to expose a portion of the surface of the first tungsten silicide layer of the lower conductor pattern, thereby forming a contact hole. Thereafter the substrate in which the contact hole is formed, is thermally treated by rapid thermal processing under $H_2$ atmosphere. A second doped polysilicon layer and the second tungsten silicide layer are then formed on the surface of the contact hole treated thermally and on the intermediate insulating, sequentially. Thereafter the second tungsten silicide layer and the second doped polysilicon layer are patterned to form an upper conductor pattern being in contact with the lower conductor pattern.

In this embodiment, the rapid thermal processing is performed at the temperature 900 to 1,000° C. for 20 to 50 second with keeping $H_2$ atmosphere to the pressure of $10^{-3}$ to $10^{-1}$ Torr. Preferably, the pressure of chamber is set at high vacuum state of $10^{-6}$ to $10^{-8}$ Torr prior to performing rapid thermal processing.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to accompanying drawings.

Figure 1A:
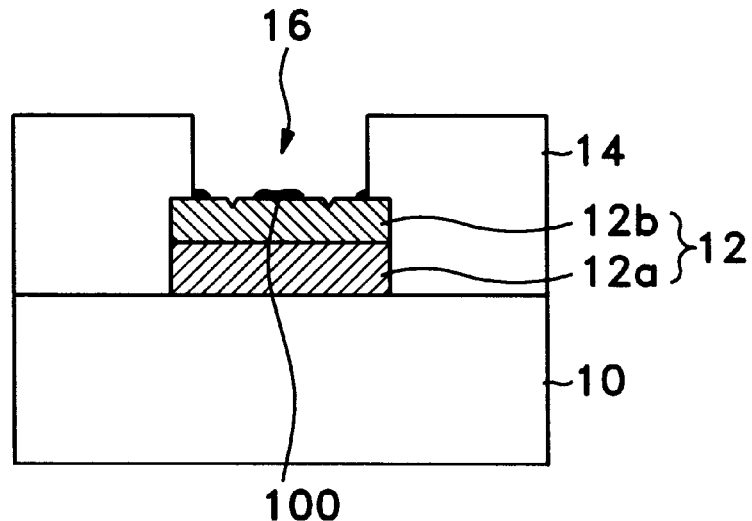
FIG. 1A and FIG. 1B show cross sectional views for describing a conventional method of forming contact between a word line and a bit line in the periphery region of a memory device.
Figure 1B:
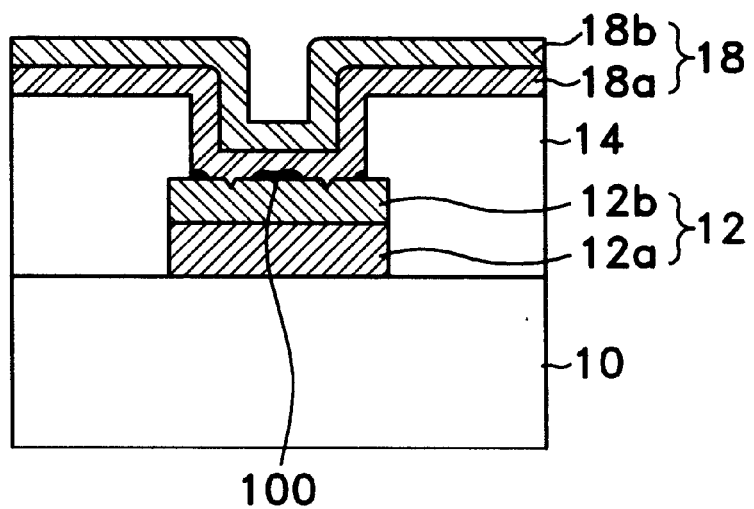
Figure 2A:
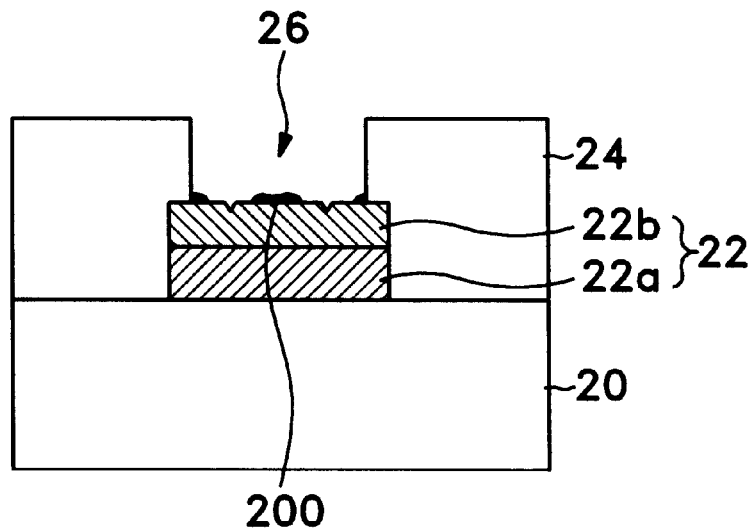
FIG. 2A to FIG. 2C show cross sectional views of a method of forming contact between a word line and a bit line in the periphery region of a memory device according to an embodiment of the present invention.
Figure 2B:
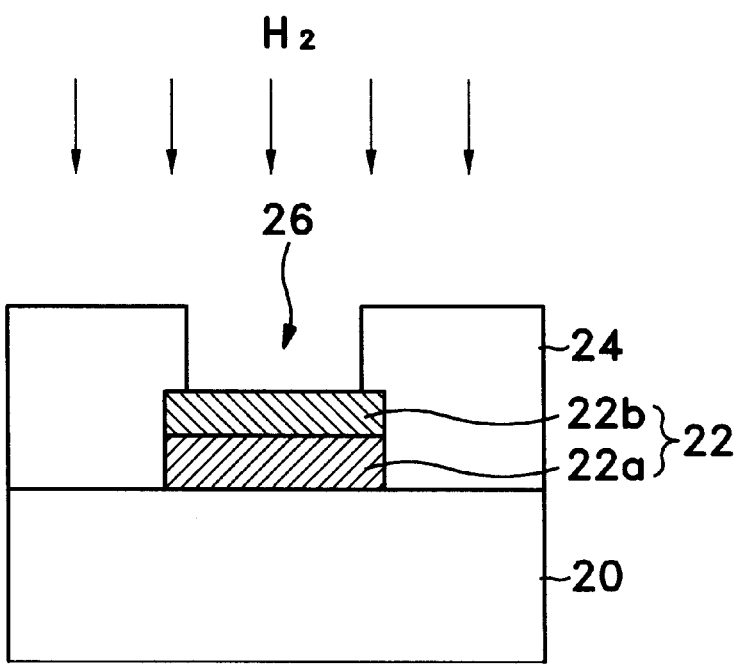
Figure 2C:
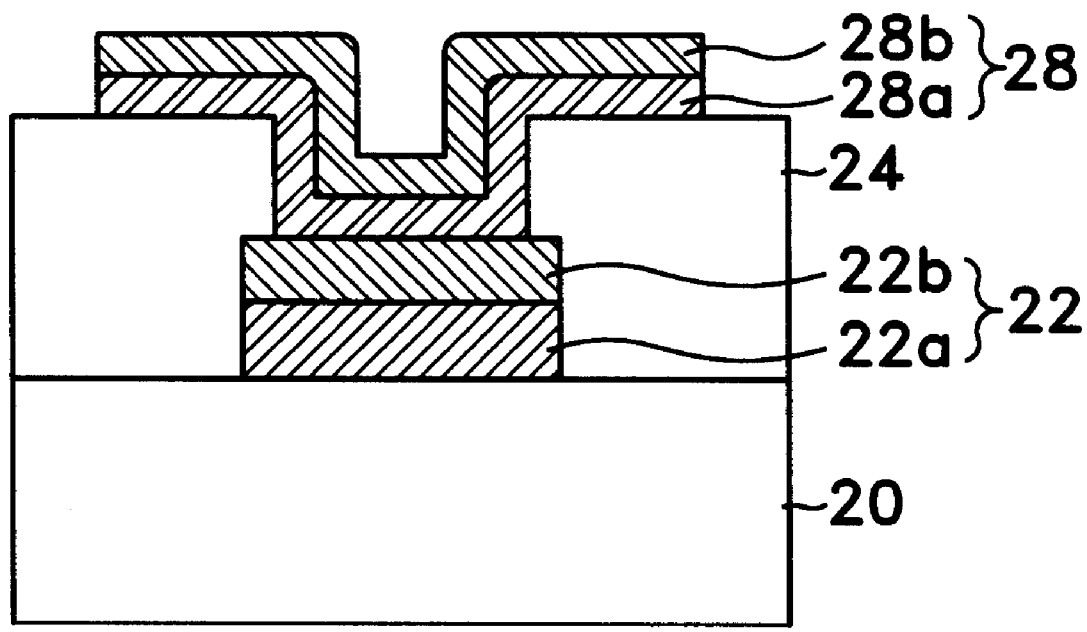

FIG. 2A and FIG. 2C show cross sectional views of a method of forming contact between a word line and a bit line in the periphery region of a memory device according to an embodiment of the present invention.

Referring to FIG. 2A, a first doped polysilicon layer 22a and a first tungsten silicide(WSix; x=2 to 2.8) layer 22b are sequentially formed on a semiconductor substrate 20. Here, the first doped polysilicon layer 22a is formed by Chemical Vapor Deposition(CVD) using $SiH_4$ gas as reactive gas and using $PH_3$ gas as dopant at the temperature of 500 to 700° C. Preferably, the ratio of $SiH_4$:$PH_3$ is 1.1:1.5 to 1.5:1.8 and the deposition thickness of the first doped polysilicon layer 22a is 500 to 1,500 Å. The first tungsten silicide layer 22b is formed by CVD using $SiH_2Cl_2$ gas and $WF_6$ gas at the temperature of 500 to 650° C. Preferably, the ratio of $SiH_2Cl_2$:$WF_6$ is 2:1 to 3:1.5 and the deposition thickness of the first tungsten silicide layer 22b is 500 to 1,500 Å.

Thereafter, the first tungsten silicide layer 22b and the first doped polysilicon layer 22a are patterned to form a word line 22. An intermediate insulating layer 24 is then formed on the overall substrate and etched by an etching using plasma gas, to expose the portions of the surface of the first tungsten silicide layer 22b of the word line 22, thereby forming a contact hole 26. At this time, the surface crystal structure of the first tungsten silicide layer 22b is transformed into amorphous and/or quasi-stable state. Furthermore, as shown in FIG. 2A, the exposed surface of the first tungsten silicide layer 22b is roughed by high sputtering yield. Moreover, insulating productions 200 as shown TABLE 1 are formed on the surface of the first tungsten silicide layer 22b.

Referring to FIG. 2B, the structure of FIG. 2A is thermally treated by Rapid Thermal Processing(RTP) under $H_2$ atmosphere. Preferably, RTP is performed at the temperature of 900 to 1,000° C. for 20 to 50 second with keeping $H_2$ atmosphere to the pressure of $10^{-3}$ to $10^{-1}$ Torr, in order to promote reduction reaction of the production 200. As a result the production 200 reacts with $H_2$ as follows, to be removed.

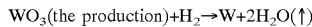

$WO_3$(the production)+$H_2$→W+$2H_2O$(↑)

Furthermore, the surface crystal structure for the first tungsten silicide layer 22b is recrystallized to be transformed into the original crystal structure and its surface is smoothed by surface migration effect. Moreover, contamination and native oxide layer remaining on the surface of the first tungsten silicide layer 22b are removed, thereby cleaning surface thereof. As a result, the surface properties of the word line 22 are improved.

Thereafter, a second doped polysilicon layer 28a and a second tungsten silicide layer 28b are sequentially formed on the surface of the contact hole 26 and on the intermediate insulating layer 24 and patterned, to a bit line 28 being in contact with the word line 22, as shown in FIG. 2C. Here, the second doped polysilicon layer 28a and the second tungsten silicide layer are formed under the same condition as the first doped polysilicon layer 22a and the first tungsten silicide layer 22b. That is, the second doped polysilicon layer 28a is formed by CVD using $SiH_4$ gas as reactive gas and using $PH_3$ gas as dopant at the temperature of 500 to 700° C. Preferably, the ratio of $SiH_4$:$PH_3$ is 1.1:1.5 to 1.5:1.8 and the deposition thickness of the second doped polysilicon layer 22a is 500 to 1,500 Å. The second tungsten silicide layer 28b is formed by CVD using $SiH_2Cl_2$ gas and $WF_6$ gas at the temperature of 500 to 650° C. Preferably, the ratio of $SiH_2Cl_2$:$WF_6$ is 2:1 to 3:1.5 and the deposition thickness of the second tungsten silicide layer 22b is 500 to 1,500 Å.

Prior to performing the RTP, additional annealing may be performed at the temperature of 600 to 900° C., for the purpose of transforming the lattice structure of the first tungsten silicide layer 22b into a square lattice structure. Furthermore, the pressure of chamber is set at high vacuum state of $10^{-6}$ to $10^{-8}$ Torr, for preventing contamination of the first tungsten silicide layer 22b.

According to the present invention, after forming a contact hole for contact between a word line and a bit line, rapid thermal processing is performed under $H_2$ atmosphere, so that processing productions and contaminations created on the surface of the word line during etching for forming the contact hole are entirely removed and the surface of the word line is recrystallized, thereby improving surface properties thereof. As a result, contact resistance between the word line and the bit line is reduced and contact interface therebetween is stabilized.

Furthermore, the method of forming contact above described is applied to a contact between interconnection lines.

Although the preferred embodiment of this invention has been disclosed for illustrative purpose, those skilled in the art will appreciate that various modifications, additions and substitutions are possible, without from the scope and spirit of the invention as described in the accompanying claims.

What is claimed is:

1. Method of manufacturing a semiconductor device, comprising the steps of;
    providing a semiconductor substrate on which a lower conductor pattern is formed, the lower conductor pattern having a first doped polysilicon layer and a first tungsten silicide layer formed thereon;
    forming an intermediate insulating layer on the substrate;
    etching the intermediate insulating layer to expose a portion of the surface of the first tungsten silicide layer of the lower conductor pattern, thereby forming a contact hole then;
    annealing the first tungsten suicide layer, the annealing is performed at the temperature of 600° C. to 900° C.; and
    recrystalizing the first tungsten silicide layer to be transformed into the original crystal structure and removing contamination and a native oxide layer remaining on the surface of the first tungsten silicide layer by rapid thermal processing, the rapid thermal processing is performed at the temperature of 900° C. to 1,000° C. under $H_2$ atmosphere.

2. The method according to claim 1, further comprising the steps of:
    forming a second doped polysilicon layer and the second tungsten silicide layer on the intermediate insulating layer and the surface of the contact hole sequentially, after the rapid thermal processing; and
    patterning the second tungsten silicon layer and the second doped polysilicon layer to form an upper conductor pattern being in contact with the lower conductor pattern.

3. The method according to claim 1, wherein the rapid thermal processing is performed with keeping $H_2$ atmosphere to the pressure of $10^{-3}$ to $10^{-1}$ Torr.

4. The method according to claim 3, wherein the rapid thermal processing is performed for 20 to 50 second.

5. The method according to claim 1, wherein the pressure of chamber is set at high vacuum state of $10^{-6}$ to $10^{-8}$ Torr prior to performing rapid thermal processing.

6. The method according to claim 2, wherein the first and second doped polysilicon layers are formed by chemical Vapor deposition at the temperature of 500 to 700° C.

7. The method according to claim 6, wherein the first and second doped polysilicon layers are formed using $SiH_4$ gas as reactive gas and using $PH_3$ gas as dopant.

8. The method according to claim 7, where in the ratio of $SiH_4:PH_3$ is 1.1:1.5 to 1.5:1.8.

9. The method according to claim 2, wherein the first and second tungsten silicide layers are formed by chemical vapor deposition at the temperature of 500 to 650° C.

10. The method according to claim 9, wherein the first and second tungsten silicide layers are formed using $SiH_2Cl_2$ gas and $WF_6$ gas.

11. The method according to claim 10, wherein the ratio of $SiH_2Cl_2:WF_6$ is 2:1 to 3:1.5.

12. The method according to claim 2, the lower conductor pattern is a word line and the upper conductor pattern is a bit line.

* * * * *